(12) United States Patent
Wang et al.

(10) Patent No.: US 11,335,692 B2
(45) Date of Patent: May 17, 2022

(54) NON-VOLATILE FLASH MEMORY DEVICE AND A MANUFACTURING METHOD THEREOF

(71) Applicant: Shanghai Huali Integrated Circuit Mfg. Co., Ltd., Shanghai (CN)

(72) Inventors: Qiwei Wang, Shanghai (CN); Jinshuang Zhang, Shanghai (CN); Haoyu Chen, Shanghai (CN); Rong Zou, Shanghai (CN); Juanjuan Li, Shanghai (CN)

(73) Assignee: SHANGHAI HUALI INTEGRATED CIRCUIT MFG. CO., LTD., Shanghai (CN)

( * ) Notice: Subject to any disclaimer, the term of this patent is extended or adjusted under 35 U.S.C. 154(b) by 73 days.

(21) Appl. No.: 17/099,760

(22) Filed: Nov. 16, 2020

(65) Prior Publication Data
US 2021/0320112 A1 Oct. 14, 2021

(30) Foreign Application Priority Data
Apr. 9, 2020 (CN) .......................... 202010274119.3

(51) Int. Cl.
| | |
|---|---|
| *H01L 27/11531* | (2017.01) |
| *H01L 29/66* | (2006.01) |
| *H01L 29/78* | (2006.01) |
| *H01L 21/28* | (2006.01) |
| *H01L 21/265* | (2006.01) |
| *H01L 21/266* | (2006.01) |
| *H01L 27/11521* | (2017.01) |
| *H01L 29/788* | (2006.01) |

(52) U.S. Cl.
CPC ...... *H01L 27/11531* (2013.01); *H01L 21/266* (2013.01); *H01L 21/26513* (2013.01); *H01L 27/11521* (2013.01); *H01L 29/40114* (2019.08); *H01L 29/66492* (2013.01); *H01L 29/66825* (2013.01); *H01L 29/7833* (2013.01); *H01L 29/7881* (2013.01)

(58) Field of Classification Search
CPC ......... H01L 27/11531; H01L 21/26513; H01L 21/266; H01L 27/11521; H01L 29/40114; H01L 29/66492; H01L 29/66825; H01L 29/7833; H01L 29/7881; H01L 27/11536; H01L 29/6653; H01L 29/6656; H01L 29/6659
See application file for complete search history.

(56) References Cited

U.S. PATENT DOCUMENTS

2011/0244640 A1* 10/2011 Lin ...................... H01L 29/7833
257/E21.294

* cited by examiner

*Primary Examiner* — David Vu
(74) *Attorney, Agent, or Firm* — Adsero IP

(57) ABSTRACT

The present disclosure provides a non-volatile flash memory device and a manufacturing method thereof. The non-volatile flash memory device comprises at least a plurality of memory cells in a memory area. The manufacturing method comprises: providing a substrate, and defining the memory area of the non-volatile flash memory device on the substrate; forming a plurality of stack gates of the plurality of memory cells on a substrate corresponding to the memory area, and the top of each stack gate is a memory control gate of the memory cell; etching the memory control gates to reduce the height of the memory control gates with the fluid photoresist filled among the plurality of stack gates of the plurality of memory cells as a mask; and removing the fluid photoresist.

10 Claims, 14 Drawing Sheets

NON-VOLATILE FLASH MEMORY DEVICE AND A MANUFACTURING METHOD THEREOF

CROSS-REFERENCE TO RELATED APPLICATIONS

The present application claims priority to Chinese Patent Application No. 202010274119.3, filed on Apr. 9, 2020, the content of which is incorporated herein by reference in its entirety.

FIELD

The disclosure relates to the field of semiconductor, in particular to a non-volatile memory device and a manufacturing method thereof.

BACKGROUND

Since the early disclosure of integrated circuits by Dr. Jack Kilby of Texas Instruments, scientists and engineers have made many disclosures and improvements in semiconductor devices and processes. In the past 50 years, the dimensions of semiconductors have been significantly reduced, which translates into an increasing processing speed and decreasing power consumption. So far, the development of semiconductors has roughly followed Moore's law, which roughly states that the number of transistors in dense integrated circuits doubles about every two years.

In the evolution of IC development, as the geometric size (i.e., the smallest component or wire that can be produced using a process) is decreased, the functional density (such as the number of interconnect elements per chip area) is generally increasing. This size decreasing process usually increases production efficiency and reduces related costs to provide benefits. However, the reduction of size leads to the increasingly complex manufacturing process of semiconductor devices. Semiconductor devices are more and more vulnerable to various defects and impurities. The failure of a single metal wire, diode or transistor often constitutes the defect of the whole chip.

Non-volatile memory (NVM) refers to the computer memory that the stored data will not disappear after the current is turned off. According to the standard whether the data in the memory can be rewritten at any time when using the computer, non-volatile memory can be divided into two categories: ROM and flash memory. In the prior art, the memory cells of non-volatile flash memory are generally divided into floating gate (FG) and charge trap (CT).

For the memory cell of floating gate non-volatile flash memory, when the node corresponding to the non-volatile flash memory technology becomes smaller and smaller, the aspect ratio (AR) of the memory cell area is also increasing correspondingly. The AR of 65 nm flash memory cell is less than 1.2, and the AR of 55 nm and 50 nm flash memory cell is more than 1.4. The deposition of the inter layer dielectric (ILD DEP) among gates becomes a great challenge. There will be a phenomenon that the failure of ILD deposition leads to the subsequently connection of through-hole and control gate, and the poor filling between bit lines leads to the connection between the bit lines and leads to the loss of yield. If the filling quality of the memory cell is enhanced by improving the ILD deposition plasma, there will be a high risk of failure of the gate oxygen integration (GOI) test.

Therefore, there is an urgent need for a non-volatile flash memory device and a manufacturing method thereof, which can ensure the filling quality of the deposition of interlayer dielectric between the gates of the memory cell area without affecting the integration of the gate oxide, to effectively improve the performance of the non-volatile flash memory device.

SUMMARY

A brief summary on one or more embodiments is given below to provide the basic understanding for these embodiments. This summary is not an exhaustive overview of all the contemplated embodiments and is neither intended to indicate critical or decisive elements of all embodiments nor to attempt to define the scope of any or all embodiments. Its sole purpose is to present some concepts of one or more embodiments in a simplified form as a preface for a more detailed description presented later.

In order to solve the above problems, one embodiment of the present disclosure provides a manufacturing method of a non-volatile flash memory device, the non-volatile flash memory device at least comprises a memory cell of a memory area, wherein the manufacturing method comprises:

providing a substrate, and defining the memory area of the non-volatile flash memory device on the substrate;

forming stack gates of the plurality of memory cells on a substrate corresponding to the memory area, and the top of each stack gate is a memory control gate of the memory cell;

etching the memory control gates to reduce the height of the memory control gates with fluid photoresist filled among the stack gates of the plurality of memory cells as mask; and removing the fluid photoresist.

In an embodiment of the manufacturing method, etching the memory control gates with fluid photoresist as mask further comprises:

depositing fluid photoresist covering the stack gates, the fluid photoresist filling gaps among the stack gates of the plurality of memory cells;

etching back the fluid photoresist to expose the memory control gates at the top of the stack gates; and etching the exposed memory control gates.

In an embodiment of the manufacturing method, the fluid photoresist is an organic dielectric layer.

In an embodiment of the manufacturing method, the etching the memory control gates to reduce the height of the memory control gates comprises:

etching the memory control gates to reduce the height of each memory control gate by 15%-30%, and/or controlling the etching of the memory control gates so that the height of each etched memory control gate is above 1400 A.

In an embodiment of the manufacturing method, forming the stack gates further comprises forming floating gates of the plurality of memory cell, and the memory control gates are formed above the floating gates.

In an embodiment of the manufacturing method, before etching the memory control gates with the fluid photoresist as mask, the manufacturing method further comprises:

performing active area ion implantation and LDD ion implantation on the top of a substrate outside the stack gates.

In an embodiment of the manufacturing method, after removing the fluid photoresist, the manufacturing method further comprises:

forming side walls on both sides of the stack gates; and performing source drain ion implantation on the top of a substrate outside the stack gates with side walls.

In an embodiment of the manufacturing method, the non-volatile flash memory device further comprises peripheral cells of a peripheral circuit area, and the manufacturing method further comprises:

defining the peripheral circuit area of the non-volatile flash device on the substrate; and synchronously forming peripheral control gates of the peripheral cells on a substrate corresponding to the peripheral circuit area while forming the memory control gates.

Another embodiment of the present disclosure further provides a non-volatile flash memory device, wherein the non-volatile flash memory device is formed by any embodiment of the above manufacturing method.

In an embodiment of the non-volatile flash memory device, the non-volatile flash memory device comprises a compact interlayer insulating layer filled among stack gates of a plurality of memory cells in the memory area.

The manufacturing method of the non-volatile flash memory device according to one embodiment of the disclosure can thin the control gate of the memory cell of the flash memory device by using the fluid photoresist as the mask, to reduce the etching aspect ratio, and provide the possibility for the subsequent improvement of the filling quality of deposition of interlayer dielectric between the control gates. On the other hand, the non-volatile flash memory device provided by the present disclosure has a compact interlayer insulating layer filled among gates after being processed in BEOL, to ensure the quality of subsequent through holes and connecting wires, and ensure the performance of the whole non-volatile flash memory device.

BRIEF DESCRIPTION OF THE DRAWINGS

After reading the detailed description of the embodiments of the present disclosure in combination with the following drawings, the above features of the disclosure can be better understood. In the drawings, the components are not necessarily drawn to scale, and components with similar related characteristics or features may have the same or similar reference marks.

REFERENCE SIGNS

Figure 1:
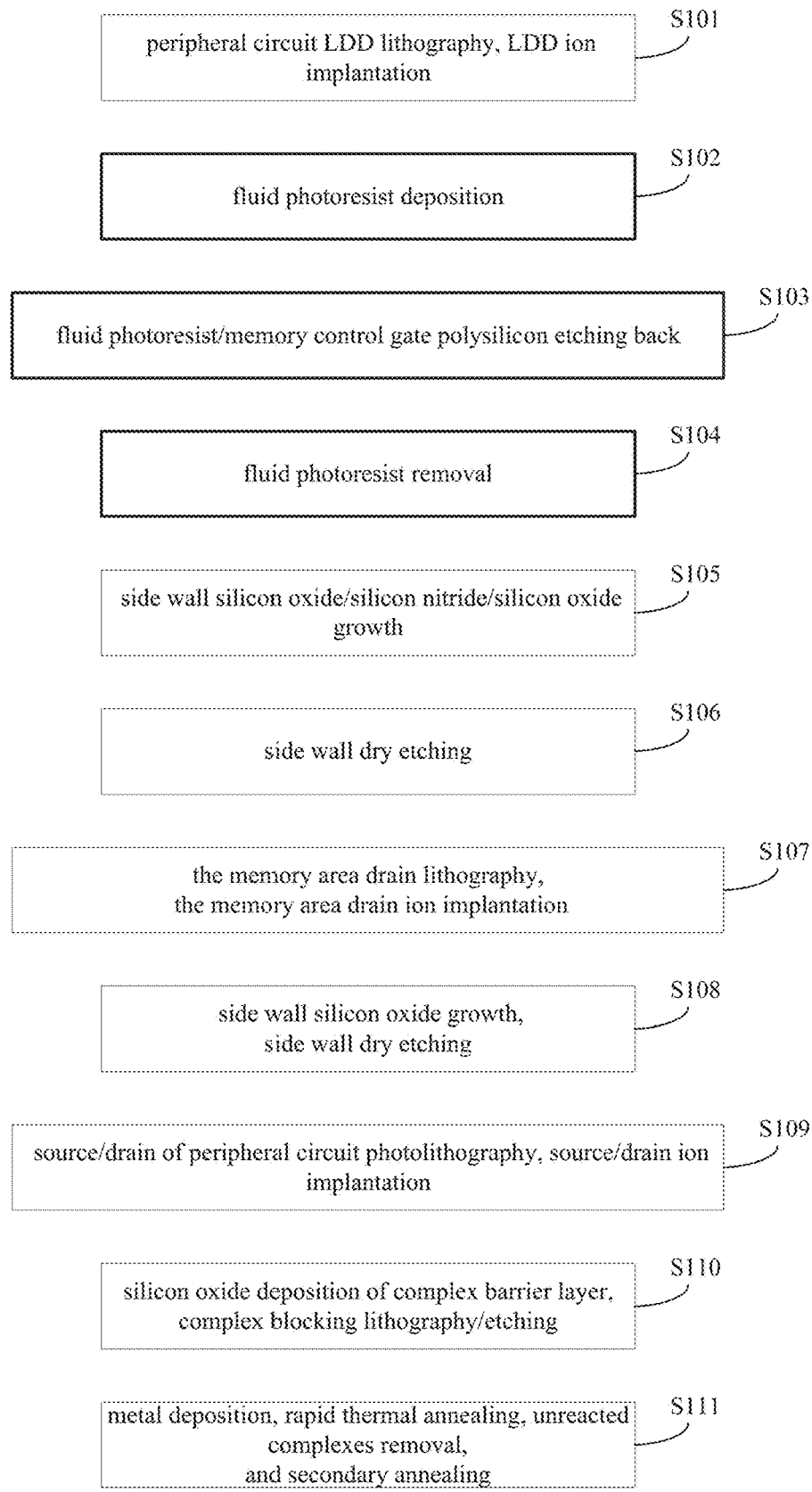
FIG. 1 shows a flow chart of a manufacturing method for a non-volatile memory device according to one embodiment of the present disclosure.

WL1-WL4 word line 1-word line 4
AA active area
CG memory control gate
CT contact
SAS self-aligned source
LDD Lightly Doped Drain
STI shallow trench isolation
100 floating gate
200 memory control gate
200' memory control gate
300 fluid photoresist
400 source/drain ion implantation region
500 inter insulting layer
900 peripheral control gate
910 source/drain ion implantation region

DETAILED DESCRIPTION

The following description is presented as embodiments of the present disclosure and incorporate it into the context of a particular application. Various modifications, as well as various usages in various applications, and the generic principles defined herein may be applicable to a wide range of embodiments. Thus, the present disclosure is not limited to the embodiments presented herein, but rather should be given its broadest scope consistent with the principles and novel features disclosed herein.

In the following detailed description, numerous specific details are set forth to provide a more thorough understanding of the present disclosure. Embodiments of the present disclosure may be practiced without limitations from these specific details. In other words, well-known structures and devices are shown in a block diagram form and are not shown in detail, to avoid obscuring the present disclosure.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

As described above, as the critical dimension in semiconductor manufacturing is shrinking, how to accurately control the line width of a semiconductor device at a low cost is an urgent problem to be solved in the art.

As mentioned above, in order to solve the problem that the aspect ratio of the memory cell area is increasing in the prior art, the present disclosure provides a manufacturing method of the non-volatile memory. Referring to FIG. 1, in order to form a complete nonvolatile memory, the manufacturing method according to one embodiment of the present disclosure at least comprises:

Step S101: peripheral circuit LDD lithography, LDD ion implantation;

Step S102: fluid photoresist deposition;

Step S103: fluid photoresist/memory control gate polysilicon etching back;

Step S104: fluid photoresist removal;

Step S105: side wall silicon oxide/silicon nitride/silicon oxide growth;

Step S106: side wall dry etching;

Step S107: the memory area drain lithography, the memory area drain ion implantation;

Step S108: side wall silicon oxide growth, side wall dry etching;

Step S109: source/drain of peripheral circuit photolithography, source/drain ion implantation;

Step S110: silicon oxide deposition of complex barrier layer, complex blocking lithography/etching;

Step S111: metal deposition, rapid thermal annealing, unreacted complexes removal, and secondary annealing.

It can be understood that before the above-mentioned step S101, the steps of providing substrate, defining memory area and peripheral circuit area, forming gates of memory cell (including floating gate and memory control gate) and control gate of peripheral circuit, active area ion implantation and LDD ion implantation in memory area need to be realized by existing or future methods.

It can be understood that the manufacturing method provided in one embodiment of the disclosure aims to effectively reduce the height of the control gate of the memory area. Therefore, it can be considered that the above steps S102-S104 are significant differences between the present disclosure and the prior art. For steps S101 and S105-S111, they may perform similar steps in various manufacturing methods of the non-volatile flash device that can or will be available to achieve similar effects. The specific description of steps S101 and S105-S111 in the disclosure shall not unduly limit the protection scope of the disclosure.

Figure 2:
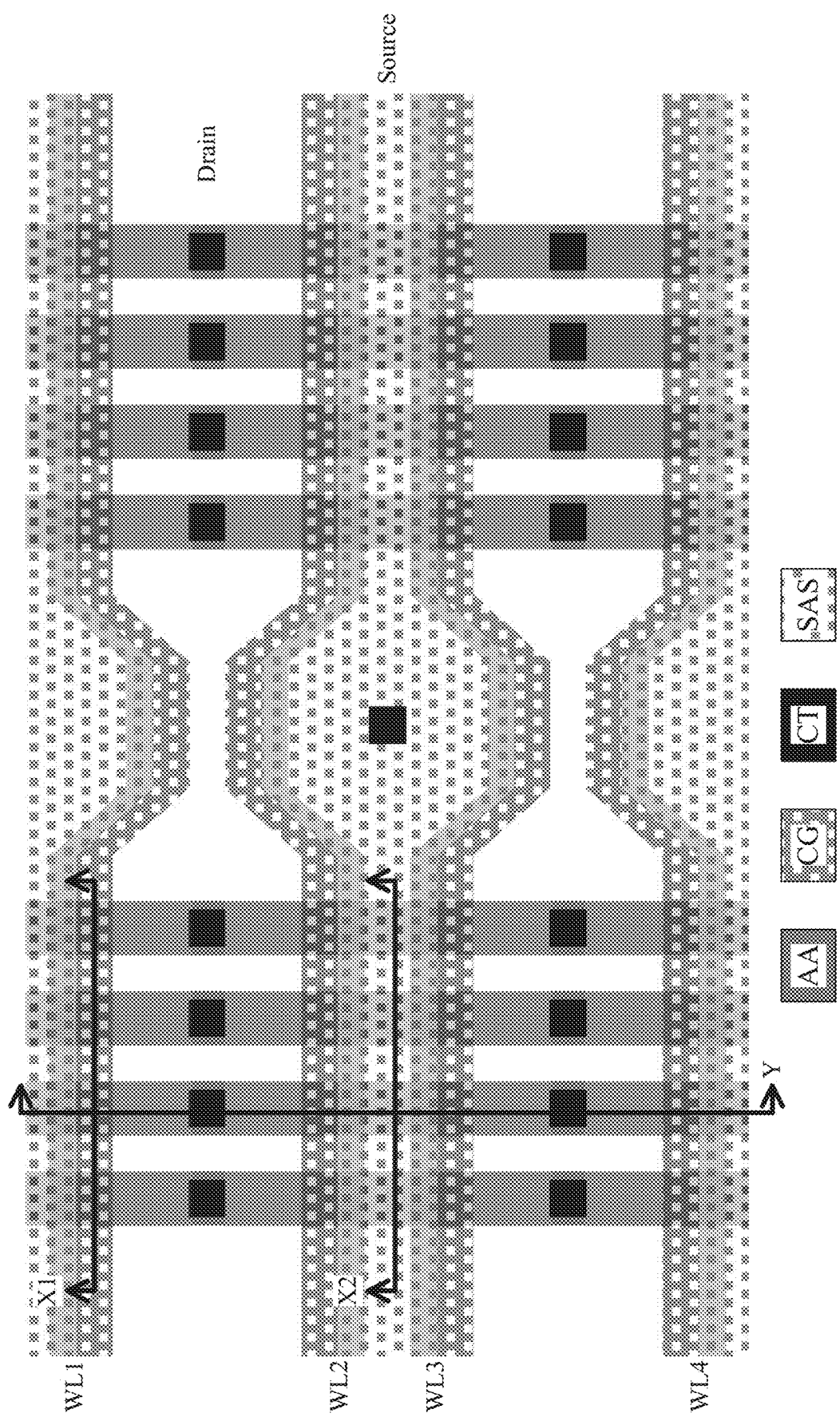
FIG. 2 shows a schematic diagram of a design layout of a memory area of a non-volatile memory device formed according to one embodiment of the present disclosure.

One embodiment of the disclosure provides a manufacturing method for manufacturing a non-volatile flash memory device according to the design layout shown in FIG. 2. It should be noted that FIG. 2 only shows the design layout of the memory area of the non-volatile flash device, and does not involve the peripheral circuit area. It can be seen from FIG. 2 that in the memory area of the non-volatile flash memory device, the active area AA of the memory cell extends along one direction, and the memory control gate CG extends along the other direction perpendicular to the active area AA to form the word line of the flash memory device, as shown in FIG. 2 for WL1-WL4, and the source/drain on both sides of the gate also extend along the extending direction of the memory control gate. It can be understood that in the embodiment shown in FIG. 2, a self-aligned source (SAS) is formed between the gates of word lines WL2 and WL3 to form a common source of the flash memory device. A drain of the flash memory device is formed between the gates of WL1 and WL2, and contacts CT for leading out the drain can be formed in BEOL (back end of line).

The non-volatile flash memory device and its manufacturing method according to one embodiment of the present disclosure will be understood in combination with FIGS. 3-14. FIG. 3-FIG. 14 show the profiles of the non-volatile flash device in directions Y, X1, X2 and XP. Directions Y, X1 and X2 can be understood in combination with the design layout shown in FIG. 2. Specifically, Y direction refers to the section direction of active area AA in the memory area, X1 direction refers to the section direction of memory control gate CG of memory unit in memory area, and X2 direction refers to section direction of memory cell in memory area except memory control gate CG (such as source). XP direction refers to the direction in the peripheral circuit area corresponding to direction X in the memory area, that is, the profile direction of the control gate in the peripheral circuit area.

Figure 3:
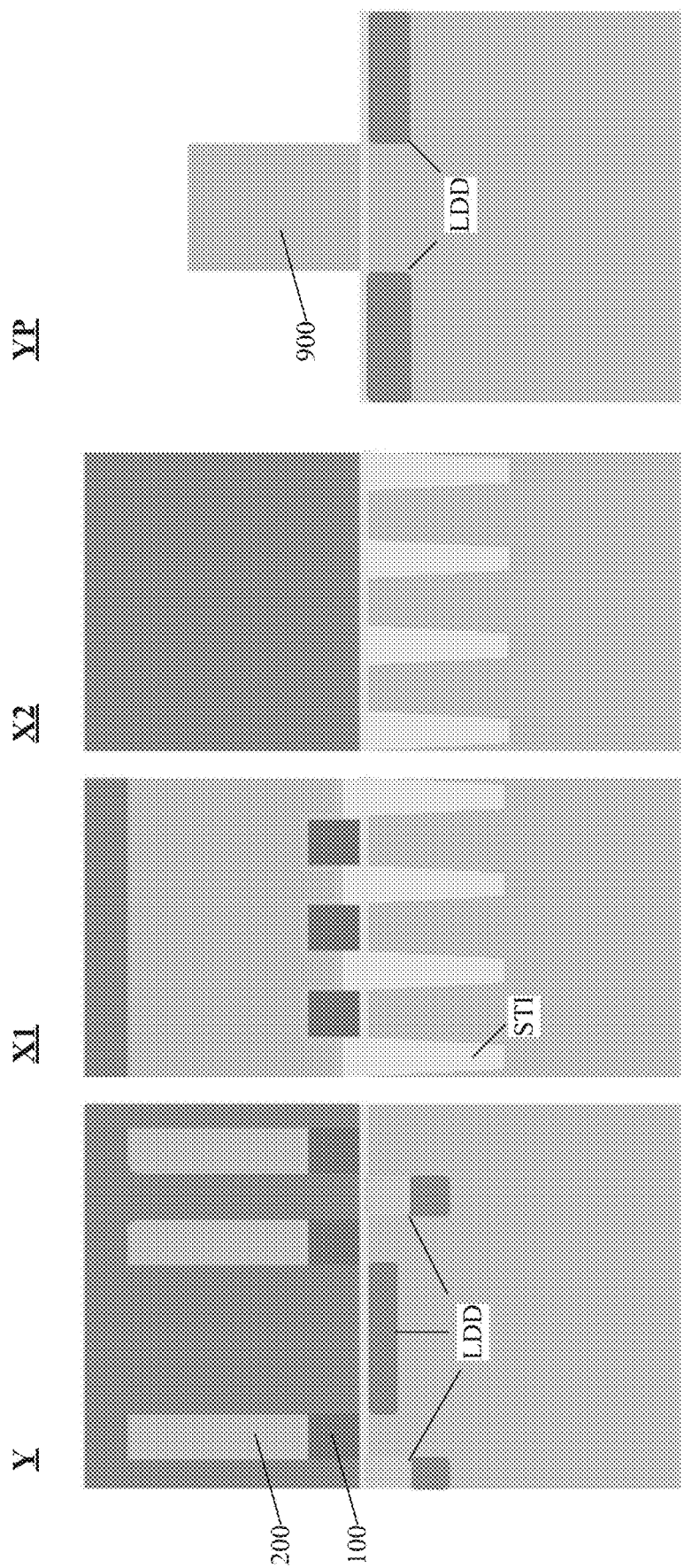
FIG. 3 shows a structural diagram of a non-volatile memory device in each direction after performing step S101 shown in FIG. 1.

First of all, please refer to FIG. 3, which shows the structure diagram of the non-volatile memory device in each direction after performing the step S101 shown in FIG. 1. As described above, although not mentioned, in order to form a complete non-volatile memory device, it is also necessary to provide substrate, define memory area and peripheral circuit area, form gates of memory cell (including floating gate and memory control gate) and control gates of peripheral circuit, perform active area ion implantation and LDD ion implantation on memory area and so on.

For example, in FIG. 3, it can be seen that the active area of the device has been defined by shallow trench isolation in the substrate of the memory area. In addition, after the active area is defined, the active area ion implantation of the active area of the substrate is needed, and a stack gate of the memory cell is formed on the surface of the substrate, specifically including the floating gate 100 at the bottom and the memory control gate 200 above the floating gate 100. It can be understood that there is a gate oxide insulating layer between the floating gate 100 and the substrate, and an insulating layer between the floating gate 100 and the memory control gate 200. After the stack gate is formed, the LDD ion implantation can be performed in the upper part of the substrate. Both active area ion implantation and LDD ion implantation are designed to improve the electrical performance of the flash device. The technical personnel can adjust the specific parameters of ion implantation according to the needs, and there is no limitation in the disclosure.

In addition, it can be seen from the XP direction of FIG. 3 that after performing step S101, the lithography of peripheral devices and the LDD ion implantation have been completed. It can be understood that the above-mentioned lithography is mainly to determine that the current operation area is the peripheral device area, that is, to open the mask or photoresist in this area, while the memory area not need to be operated is still protected by the mask or photoresist. It should be noted that although not mentioned, a step of forming a peripheral control gate 900 or the like of a peripheral device on the substrate may also be comprised before step S101.

It can be seen from FIG. 3 that the height of the memory control gate 200 of the memory area is basically the same as that of the peripheral control gate 900, that is, the height is large. In one embodiment, the height of the memory control gate 200 and the peripheral control gate 900 is 2000 A.

The memory control gate 200 and the peripheral control gate 900 have a large height. On one hand, the control gate with a larger height can ensure that the device is not easily broken down in the ion implantation steps such as active area ion implantation and LDD ion implantation, to avoid device failure.

On the other hand, it can be understood that before step S101, the memory control gate of the memory cell and the peripheral control gate of the peripheral circuit can be synchronously formed in the same step, thus saving the step of forming the gate and reducing the manufacturing cost. Therefore, in order to ensure the device safety of the peripheral circuit, the memory control gate 200 has the same height (or thickness) as the peripheral control gate 900 to avoid breakdown.

As described above, although the stack gate with larger height can reduce the influence of ion implantation on the device, the problem of the sharp increase of aspect ratio caused by the lager height of the stack gate cannot be ignored. Since the stack gate in the memory area as shown in FIG. 3 has experienced active area ion implantation and LDD ion implantation, reducing the height of memory control gate 200 at this time can avoid the negative effects of these two important ion implantation on the device.

Figure 4:
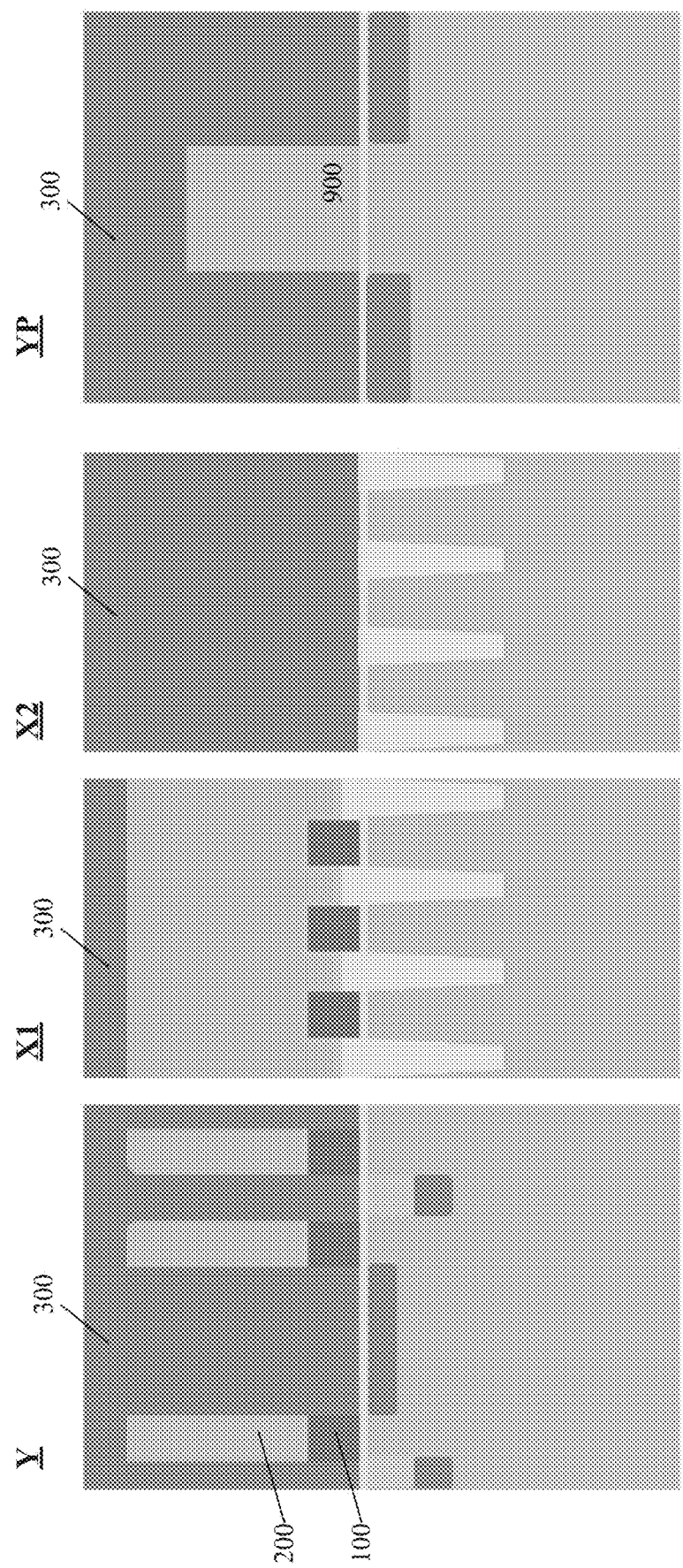
FIG. 4 shows a structural diagram of a non-volatile memory device in each direction after performing step S102 shown in FIG. 1.

Therefore, in response to the LDD ion implantation in the peripheral circuit is completed, performing step S102: depositing the fluid photoresist. Please understand it in combination with FIG. 4. FIG. 4 shows a schematic diagram of depositing the fluid photoresist 300 in both the memory area and the peripheral circuit area. Fluid photoresist can also be understood as organic dielectric layer (ODL).

The fluid photoresist ODL has the advantages of good filling performance, smooth surface after filling and easy removal. Therefore, the gap between stack gate and stack gate can be easily filled by using the fluid photoresist.

Figure 5:
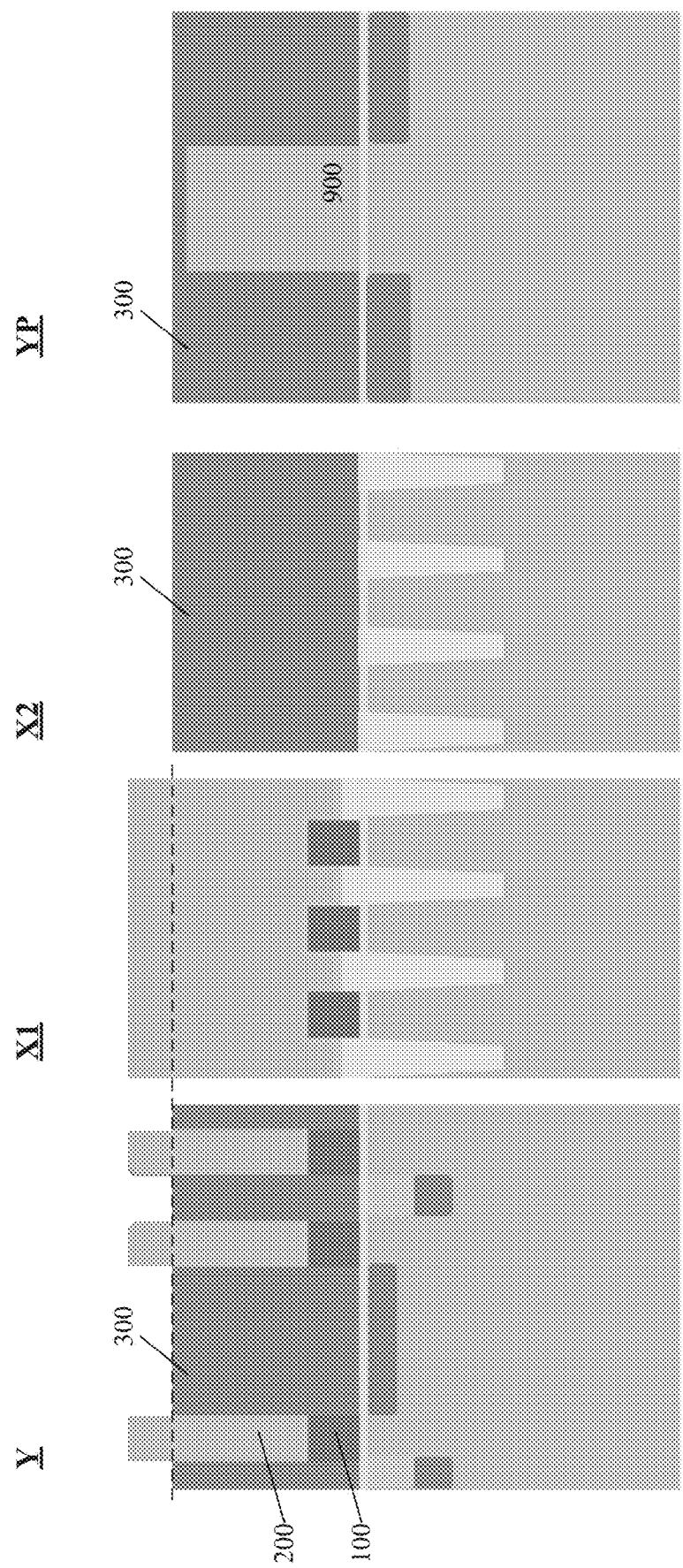
FIG. 5 shows a structural diagram of a non-volatile memory device in each direction during the execution of step S103 shown in FIG. 1.
Figure 6:
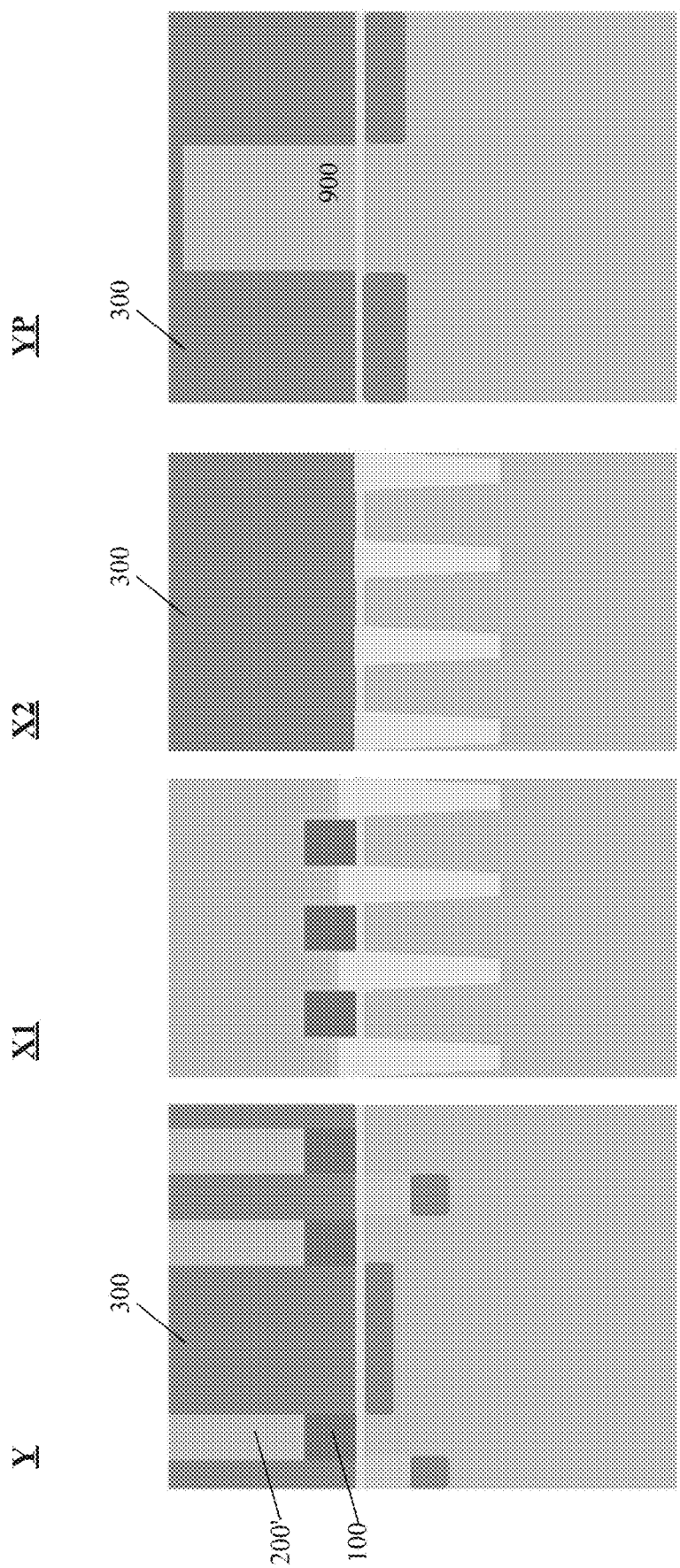
FIG. 6 shows a structural schematic diagram of a non-volatile memory device in each direction after performing step S103 shown in FIG. 1.

Please further understand step S103: fluid photoresist/memory control gate polysilicon etching back in combination with FIGS. 5 and 6. As shown in FIG. 5, the memory control gate at the top of the stack gate can be exposed by etching back the fluid photoresist 300 (as shown in the upper half of the dotted line in FIG. 5). It can be understood that the etching back of the fluid photoresist 300 can be realized by the existing or future dry etching process.

Then, the memory control gate exposed at the top of the stack gate can be etched with the fluid photoresist 300 as mask. As shown in FIG. 6, the memory control gate exposed at the top of the stack layer has been etched back. Therefore, after performing step S103, the height of the memory control gate 200' of the memory area is thinned, thus effectively reducing the aspect ratio. In one embodiment, the memory control gate is etched to reduce the height of the memory control gate by 15%-30%. The height of the control gate in the peripheral circuit area remains unchanged.

According to one embodiment of the disclosure, the manufacturing method reduces the aspect ratio of the stack gate of the memory cell, making the insulating dielectric between the subsequent gates easier to fill, and greatly reduces the short circuit between the contact and control gate (CT to CG bridge) and the short circuit between bit lines (BL to BL Bridge) caused by the poor deposition of the interlayer dielectric layer leading to the yield loss of devices, which greatly improves the safety window of interlayer dielectric layer filling.

Although the aspect ratio is effectively reduced after the control gate is thinned, there is a high-energy drain ion implantation in the subsequent process of the manufacturing of non-volatile flash devices. If the control gate is too thin, there will be the risk of ion implantation penetration and the safety window is too small.

The results show that when the height of the original memory control gate is 2000 A and the memory control gate is thinned to 1300 A, the safety window is only 20%, which is a risk for the subsequent drain ion implantation. When the height of the memory control gate is controlled at 1400 A, the security window will increase greatly, reaching 30%. Therefore, in order to avoid the breakdown risk caused by source/drain high energy ion implantation in the subsequent process, it is necessary to control the height of the memory control gate to be above 1400 A.

In one embodiment, the height of memory control gate is reduced by 300 A. In this case, the problem of excessive aspect ratio can be improved, the filling quality of subsequent interlayer dielectric layer and the performance of device can be improved effectively.

In the above-mentioned embodiment, since the height of the control gate of the peripheral circuit area remains unchanged, the peripheral control gate will not be affected by the source/drain ion implantation of the peripheral circuit in the subsequent process, and can still ensure sufficient security window.

Figure 7:
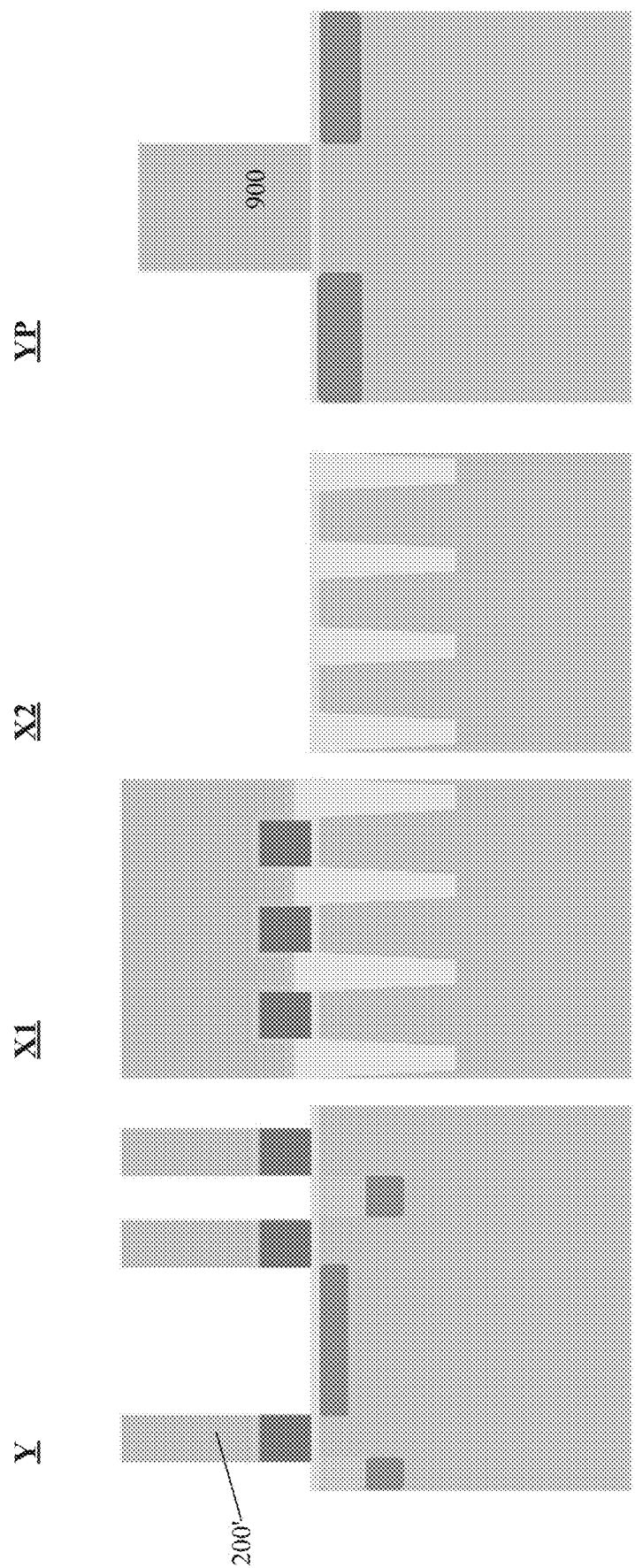
FIG. 7 shows a structural diagram of a non-volatile memory device in each direction after performing step S104 shown in FIG. 1.

FIG. 7 shows a structural diagram of a non-volatile memory device in each direction after performing step S104 as shown in FIG. 1. Step S104 is specifically to remove the fluid photoresist. At this time, the height of the memory control gate 200' in the memory area has been effectively reduced, which is significantly lower than that of the peripheral control gate 900 of the peripheral circuit. As mentioned above, the fluid photoresist is easy to remove, so it will not leave any residue on the surface of the device after removing the fluid photoresist, and will not affect the subsequent process. In one embodiment, the flow photoresist can be removed by dry etching with wet etching.

Figure 8:
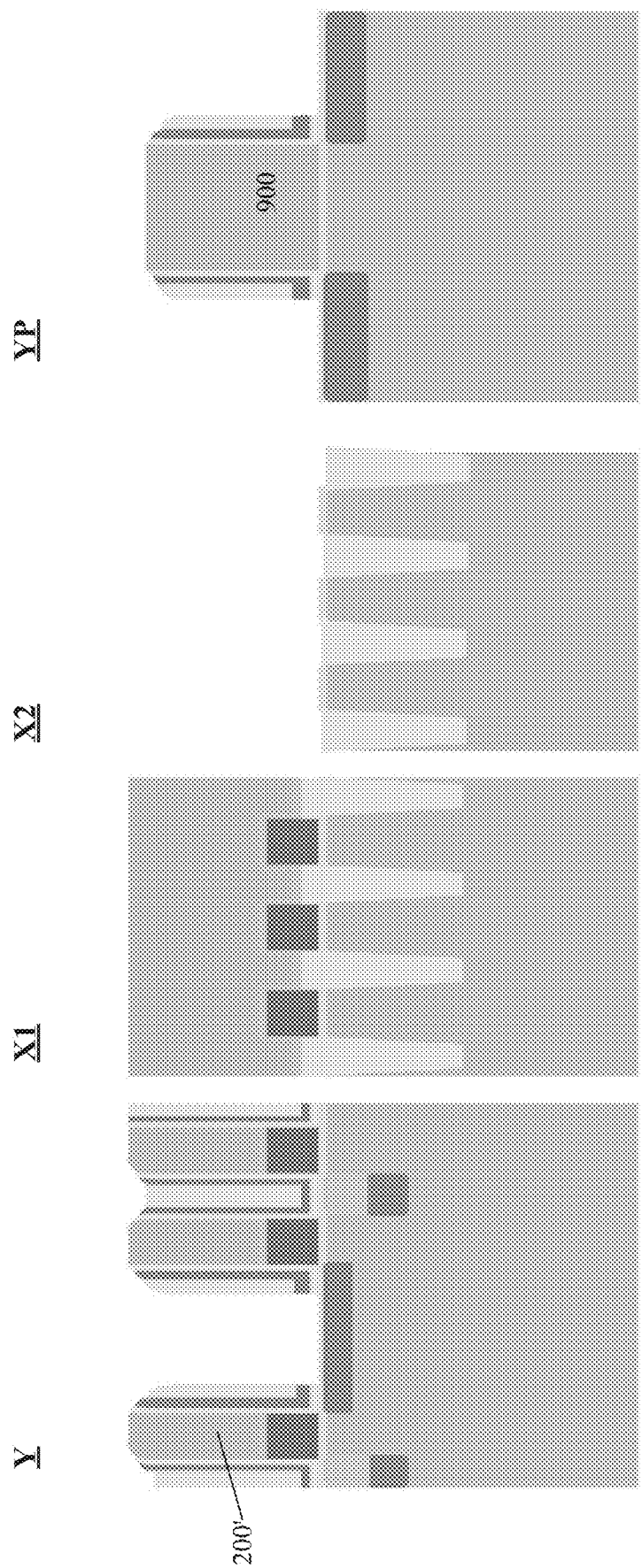
FIG. 8 shows a structure diagram of the non-volatile memory device in each direction after performing steps S105 and S106 shown in FIG. 1.

FIG. 8 shows the structure diagram of the non-volatile memory device in each direction after the steps S105 and S106 shown in FIG. 1 are performed. Step S105 refers to the growth of side wall silicon oxide/silicon nitride/silicon oxide, and the ONO side wall can protect the gate in the subsequent. Step S106 refers to the dry etching of the side wall so that the side wall is formed on both sides of the memory control gate 200' and the peripheral control gate 900. The size of the ONO sidewalls formed on both sides of the memory control gate 200' can also be used to define the width of the subsequent drain ion implantation region. FIG. 8 shows an etched ONO sidewall formed on both sides of the memory control gate 200' and an ONO sidewall formed on both sides of the peripheral control gate 900. Embodiment of present disclosure can form the above-mentioned ONO side wall and etch the ONO side wall using the existing or future technologies. The specific limitation on the formation and etching of ONO side wall should not unduly limit the protection scope of the disclosure.

Figure 9:
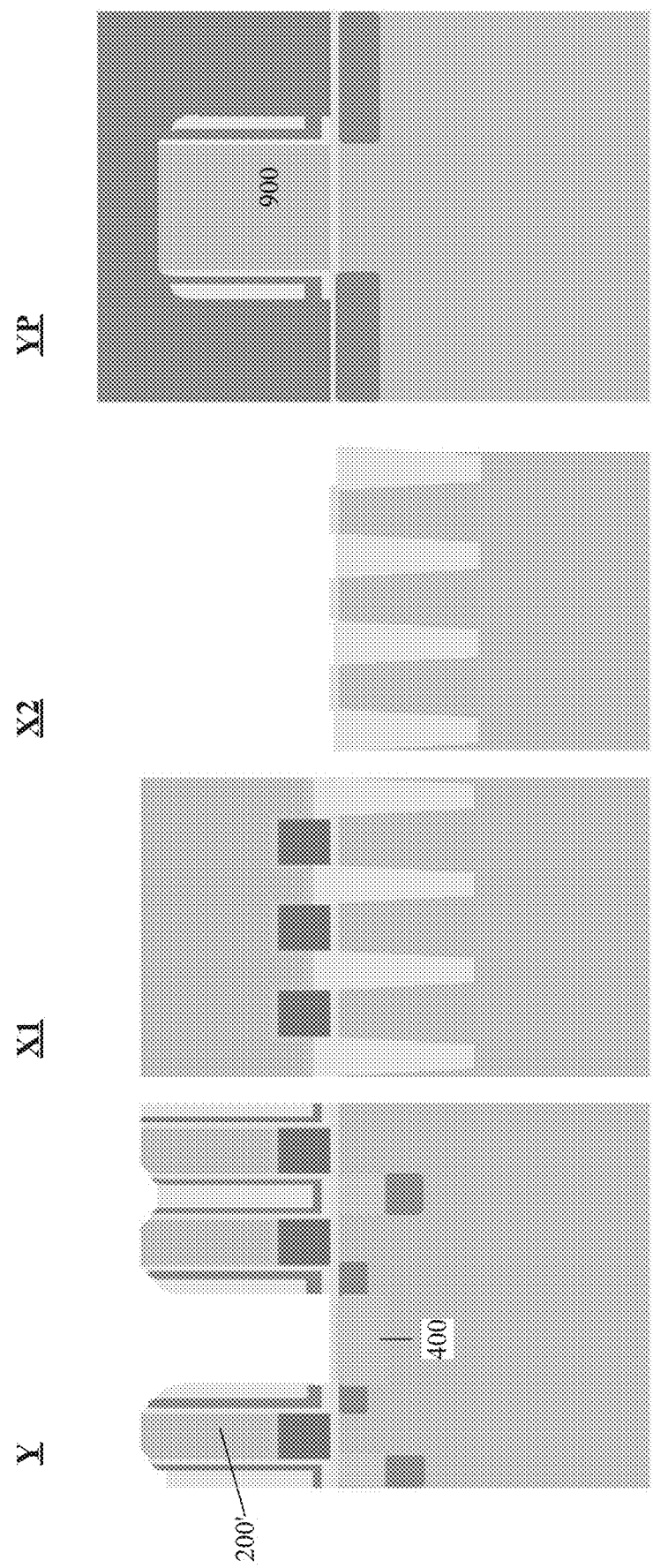
FIG. 9 shows a structural diagram of a non-volatile memory device in each direction after performing step S107 shown in FIG. 1.

FIG. 9 shows a structural diagram of a non-volatile memory device in each direction after performing step S107 shown in FIG. 1. Step S107 refers to the memory area drain lithography and the memory area drain ion implantation. Step S107 only processes the memory area, and does not process the peripheral circuit area. It can be seen from FIG. 9 that a source/drain ion implantation region 400 (which can be considered as a drain ion implantation region) is formed on the top of the substrate outside the stack gate after forming the side wall. As described above, the width of the source/drain ion implantation region 400 may be defined by the size of the side wall. Although the height of the memory control gate 200' has been thinned in the previous process, due to the effective control of the height of the memory control gate 200' to be above 1400 A, the drain ion implantation of memory area will not break down the memory control gate 200', to ensure the performance of the device. Embodiments of the present disclosure can form the source/drain ion implantation region 400 using the existing or future technologies, and can also adjust the ion implantation concentration of the source/drain ion implantation region 400 as required. The specific limitation of the source/drain ion implantation region 400 should not unduly limit the protection scope of the disclosure.

Figure 10:
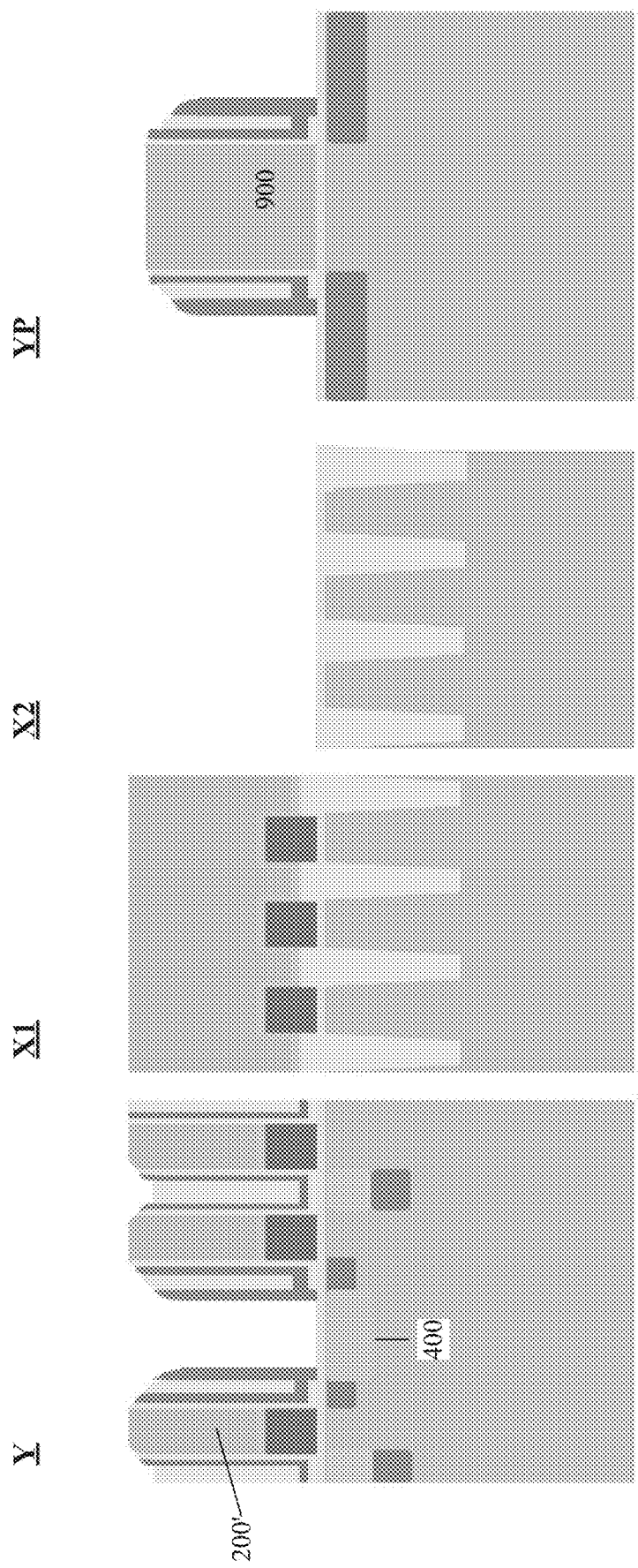
FIG. 10 shows a structural diagram of a non-volatile memory device in each direction after performing step S108 shown in FIG. 1.

FIG. 10 shows a structural diagram of a non-volatile memory device in each direction after performing step S108 shown in FIG. 1. Step S108 refers to silicon oxide growth and dry etching. Step S108 synchronously grows the outermost silicon oxide side wall in the memory area and the peripheral circuit area. The outermost silicon oxide side wall can further protect the memory control gate and the peripheral control gate. Furthermore, the silicon oxide side wall formed on both sides of the peripheral control gate 900 can also be used to define the distance between the subsequent source/drain ion implantation regions. Embodiments of the disclosure can form the above-mentioned silicon oxide side wall and etch the silicon oxide side wall using existing or future technologies. The specific limitation on the formation and etching of silicon oxide side wall should not unduly limit the protection scope of the disclosure.

Figure 11:
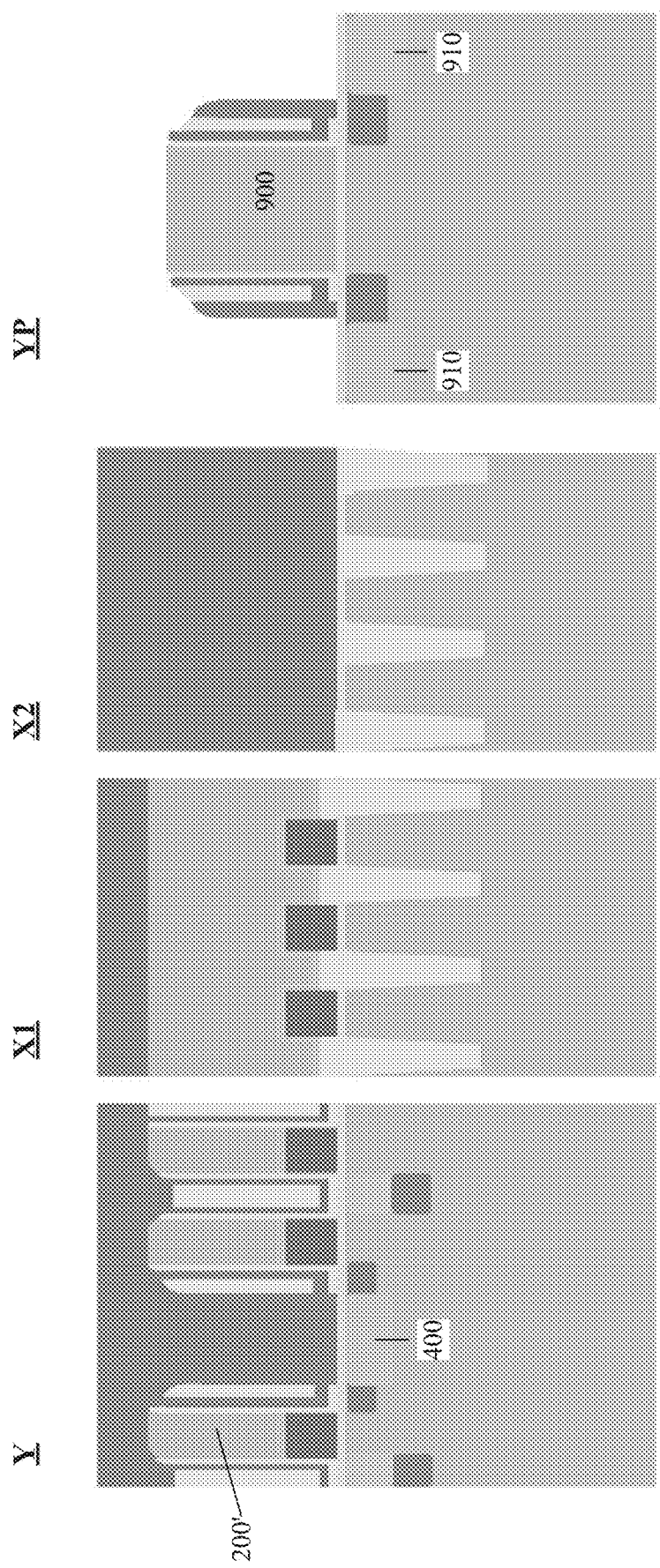
FIG. 11 shows a structural diagram of a non-volatile memory device in each direction after performing step S109 shown in FIG. 1.

FIG. 11 shows a structural diagram of a non-volatile memory device in each direction after performing step S109 shown in FIG. 1. Step S109 refers to the lithography of the source/drain and the source/drain ion implantation of the peripheral circuit. Step S109 only processes the peripheral circuit area, and does not process the memory area. It can be seen from FIG. 11 that a source/drain ion implantation region 910 is formed at the top of the substrate outside the peripheral gate after the formation of the outermost side wall. As described above, the distance between the source/drain ion implantation regions 910 on both sides can be defined by the size of the ONO side wall and the outermost silicon oxide side wall. Since the height of the peripheral control gate 900 is not thinned in the previous process, the drain ion implantation of the peripheral circuit does not break down the peripheral control gate 900 in step S109, thus ensuring the performance of the device. Embodiments of the disclosure can form the source/drain ion implantation regions 910 using the existing or future technologies, and can also adjust the ion implantation concentration of the source/drain ion implantation regions 910 as required. The specific limitation of the source/drain ion implantation regions 910 should not unduly limit the protection scope of the disclosure.

Figure 12:
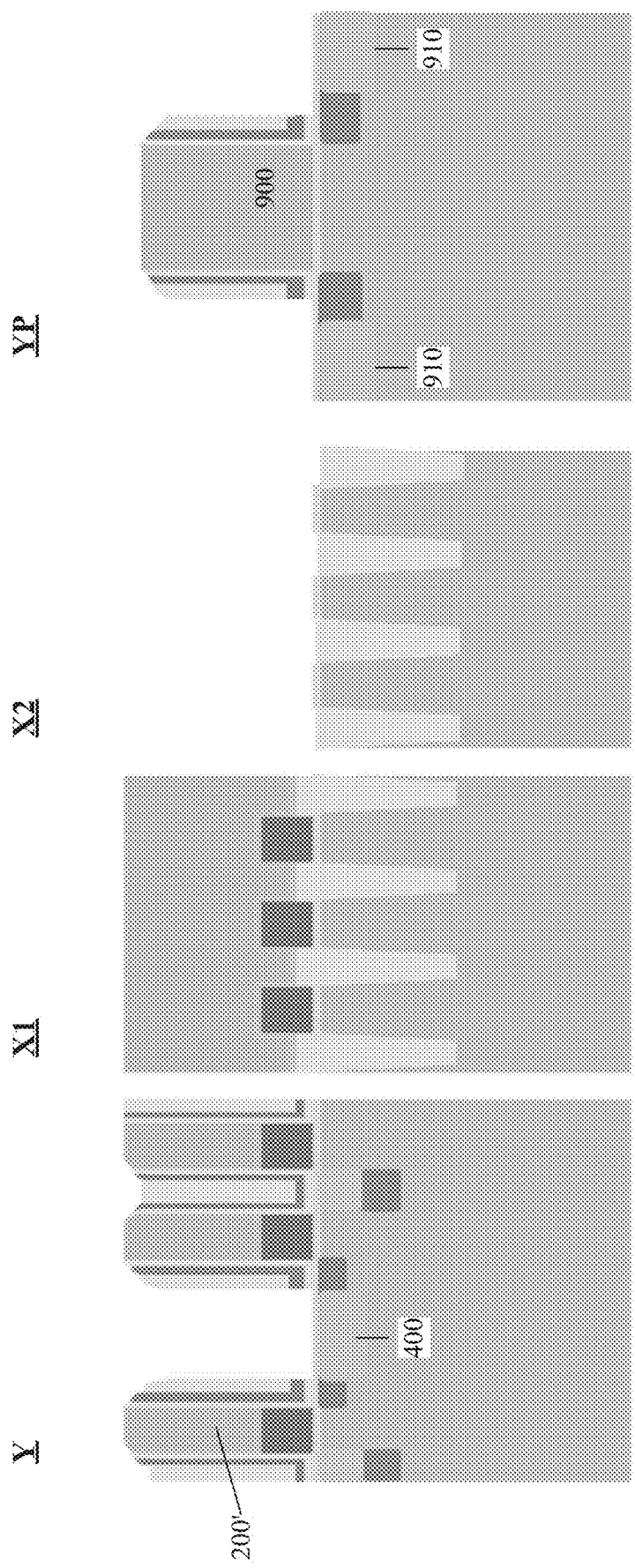
FIG. 12 shows a structure diagram of a non-volatile memory device in each direction after removing the outer side wall formed in step S108 as shown in FIG. 1.

FIG. 12 shows the structure diagram of the non-volatile memory device in each direction after removing the outermost silicon oxide side wall formed in step S108 as shown in FIG. 1. Some embodiments can remove the outermost silicon oxide side wall using existing or existing technologies, and the specific limitation on the outermost silicon oxide side wall shall not unduly limit the protection scope of the disclosure.

Figure 13:
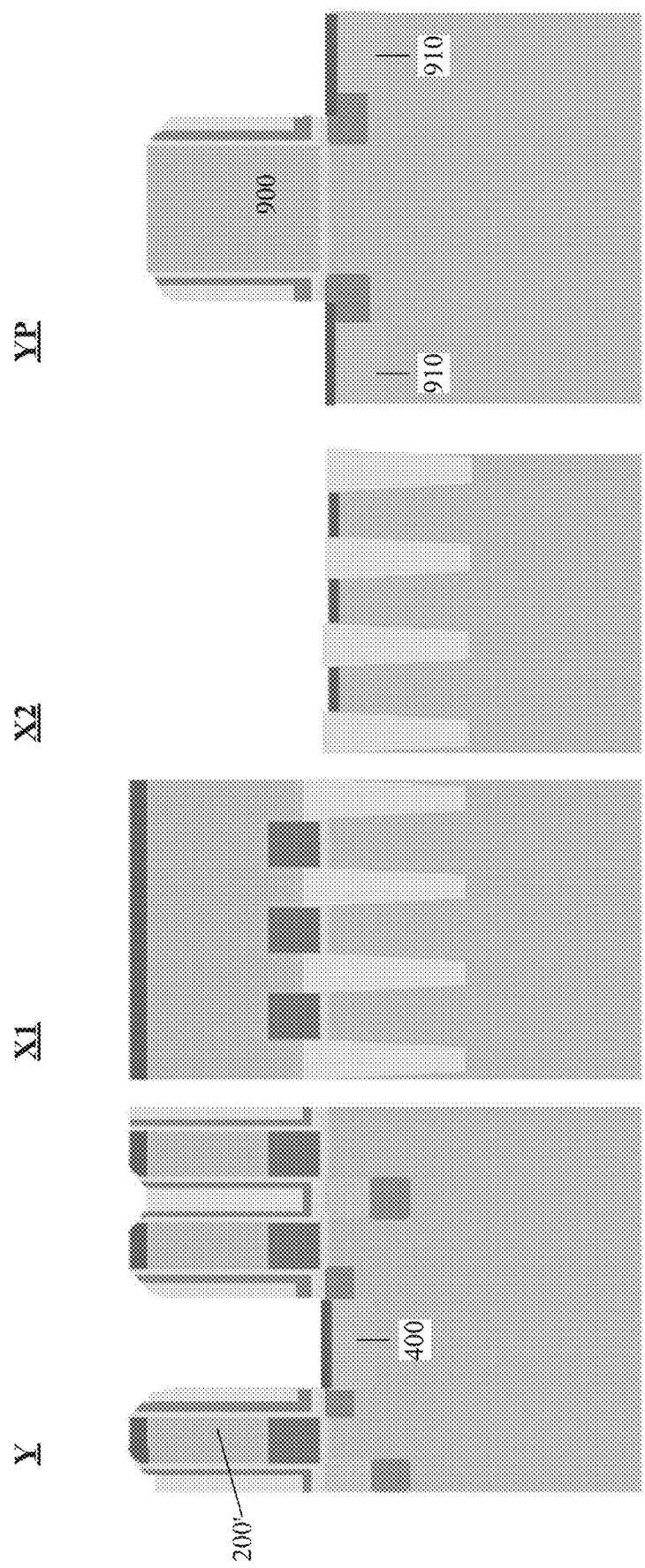
FIG. 13 shows a structure diagram of the non-volatile memory device in each direction after performing steps S110 and S111 shown in FIG. 1.

FIG. 13 shows the structure diagram of the non-volatile memory device in each direction after the steps S110 and S111 shown in FIG. 1 are performed. Step S110 refers to the deposition of complex silicon oxide barrier layer, and the complex block lithography/etching. Step S111 refers to metal deposition, rapid thermal annealing, removal of unreacted complexes and secondary annealing. The complex barrier layer may be used to define areas where the metal deposition and the complex formation are not needed. In FIG. 13, the metal is finally formed on the top of the memory control gate 200', the memory cell drain, and the source/drain of the peripheral cell of the peripheral circuit area. The rapid thermal annealing in S111 can make the metal react with the substrate silicon to form complex, and the secondary annealing can effectively reduce the contact resistance. Some embodiments can perform step S110 and step S111 using existing or future technologies, and the specific limitation on performing step S110 and step S111 shall not unduly limit the protection scope of the disclosure.

Therefore, the main steps of a manufacturing method for a non-volatile flash memory device provided in one embodiment of the present disclosure have been described. According to one embodiment of the disclosure, the manufacturing method of the provided non-volatile flash memory device can make the insulating dielectric between the subsequent gates easier to fill by reducing the aspect ratio of the stack gate of the memory cell, which greatly reduces the risk of short circuit between contact and control gate (CT to CG bridge) and short circuit between bit line and bit line (BL to BL bridge) due to poor deposition of interlayer dielectric. Then the yield loss is reduced, the safety window of interlayer filling is greatly improved.

By reasonably controlling the reduction of the height of the memory control gate, some embodiments cannot only ensure that the aspect ratio of the stacked gate is effectively reduced, but also that in the subsequent process of high-energy ion implantation, there will be no breakdown risk caused due to the gate being too thin and the safety window being too small. Reducing the height of the memory control gate is performed after LDD ion implantation and active area ion implantation, which avoids the influence on these two important ion implantation channels. The height of the control gate of the peripheral cell of the peripheral circuit will not be changed, so the source/drain ion implantation of the peripheral circuit will not be affected, which can ensure sufficient security window.

In one embodiment of the disclosure, the manufacturing method of the non-volatile flash memory device provided by the disclosure still uses the existing machine without using additional mask, to reduce the cost.

Another embodiment of the disclosure also provides a non-volatile flash memory device formed by the above manufacturing method. Moreover, in another embodiment, the non-volatile flash memory device provided by another embodiment of the present disclosure has a compact interlayer insulating layer filled among stack gates of a plurality of memory cells in the memory area after BEOL. It is precisely because the manufacturing method provided by the disclosure can effectively reduce the aspect ratio of the memory cell of the nonvolatile flash memory device, so that the subsequent inter insulation layer can be compact and free of holes.

Figure 14:
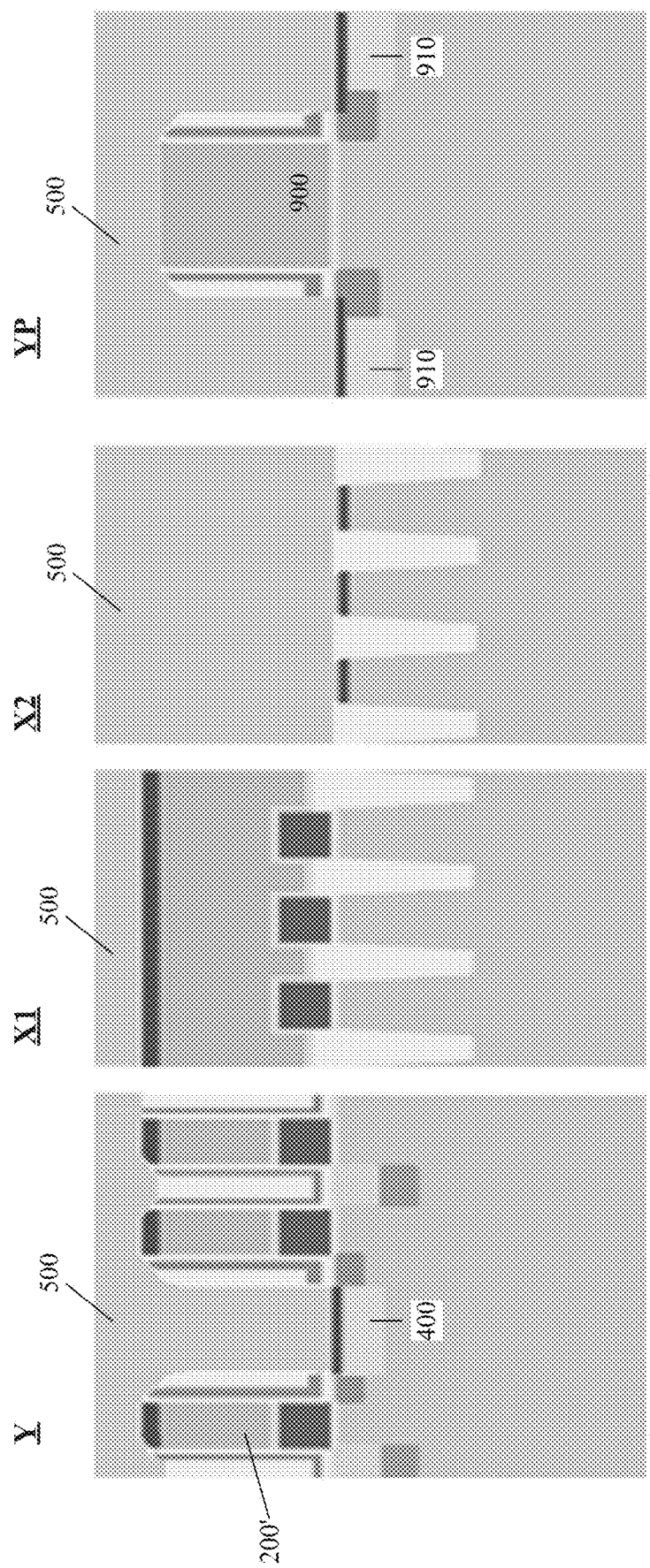
FIG. 14 shows a structure diagram of a non-volatile flash memory device provided by another embodiment of the present disclosure.

FIG. 14 shows a structural diagram of the non-volatile flash memory device with a compact interlayer insulation layer 500. The defects of CT to CG bridge between contact and control gate and BL to BL bridge between bit lines can be improved by improving the filling quality of interlayer insulating layer 500, thus reducing the yield loss caused by the defect and improving the yield of non-volatile flash devices.

Although the present disclosure has been described with respect to some embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A manufacturing method of a non-volatile flash memory device, the non-volatile flash memory device comprises at least a plurality of memory cells in a memory area, wherein the manufacturing method comprises:
   providing a substrate, and defining the memory area of the non-volatile flash memory device on the substrate;
   forming stack gates of the plurality of memory cells on the substrate corresponding to the memory area, a top of each stack gate is a memory control gate of the memory cell;
   etching memory control gates to reduce a height of the memory control gates with fluid photoresist filled among the stack gates of the plurality of memory cells as mask; and
   removing the fluid photoresist.

2. The manufacturing method of claim 1, wherein the etching the memory control gates with fluid photoresist as mask further comprises:
   depositing the fluid photoresist covering the stack gates, the fluid photoresist filling gaps among the stack gates of the plurality of memory cells;
   etching back the fluid photoresist to expose the memory control gates at the top of the stack gates; and
   etching the exposed memory control gates.

3. The manufacturing method of claim 1, wherein the fluid photoresist is an organic dielectric layer.

4. The manufacturing method of claim 1, wherein the etching the memory control gates to reduce the height of the memory control gates comprises:
   etching the memory control gates to reduce the height of each memory control gate by 15%-30%, and/or
   controlling the etching of the memory control gates so that the height of each etched memory control gate is above 1400 A.

5. The manufacturing method of claim 1, wherein forming the stack gates further comprises forming floating gates of the plurality of memory cell, and the memory control gates are formed above floating gates.

6. The manufacturing method of claim 1, wherein before etching the memory control gates with the fluid photoresist as mask, the manufacturing method further comprises:
   performing active area ion implantation and LDD ion implantation on the top of the substrate outside the stack gates.

7. The manufacturing method of claim 1, wherein after removing the fluid photoresist, the manufacturing method further comprises:
   forming side walls on both sides of the stack gates; and
   performing source drain ion implantation on the top of the substrate outside the stack gates with side walls.

8. The manufacturing method of claim 1, wherein the non-volatile flash memory device further comprises peripheral cells of a peripheral circuit area, and the manufacturing method further comprises:
   defining the peripheral circuit area of the non-volatile flash device on the substrate; and
   synchronously forming peripheral control gates of the peripheral cells on the substrate corresponding to the peripheral circuit area while forming the memory control gates.

9. A non-volatile flash memory device, wherein the non-volatile flash memory device is formed by a manufacturing method according to claim 1.

10. The non-volatile flash memory device of claim 9, wherein the non-volatile flash memory device comprises a compact interlayer insulating layer filled among stack gates of a plurality of memory cells in the memory area.

* * * * *